United States Patent [19]
Rainbolt

[11] Patent Number: 5,465,268
[45] Date of Patent: Nov. 7, 1995

[54] DIGITAL DECODING OF BIPHASE-MARK ENCODED SERIAL DIGITAL SIGNALS

[75] Inventor: Joe L. Rainbolt, Colfax, Calif.

[73] Assignee: The Grass Valley Group, Inc., Nevada City, Calif.

[21] Appl. No.: 181,512

[22] Filed: Jan. 14, 1994

[51] Int. Cl.$^6$ ............................. H03D 3/22; H03M 5/06; H03L 7/00
[52] U.S. Cl. ............................. 375/333; 341/70; 331/1 A
[58] Field of Search ............................. 375/87, 120, 100; 341/70; 331/1 A

[56] References Cited

U.S. PATENT DOCUMENTS

| | | | |
|---|---|---|---|
| 4,112,383 | 9/1978 | Burgert | 329/50 |
| 5,103,467 | 4/1992 | Bedlek | 375/118 |
| 5,111,160 | 5/1992 | Hershberger | 331/1 A |
| 5,164,966 | 11/1992 | Hershberger | 375/110 |
| 5,208,678 | 5/1993 | Nakagawa | 358/341 |
| 5,245,667 | 9/1993 | Lew | 381/94 |
| 5,329,556 | 7/1994 | Meitner | 375/106 |

Primary Examiner—Edward L. Coles, Sr.
Assistant Examiner—John Ning
Attorney, Agent, or Firm—Francis I. Gray

[57] ABSTRACT

A digital decoder for a biphase-mark encoded serial digital signal detects edges in the encoded serial digital signal by sampling with a sample clock to produce a blivet signal. The blivet signal is filtered by a one-bit digital lowpass filter to recover a decoded clock signal and to generate a transition window signal. The blivet and window signals are used to detect whether there is a transition within each bit interval defined by the decoded clock signal. A decoded serial digital signal has a logical one for each bit interval in which a transition occurs, and a logical zero otherwise.

12 Claims, 2 Drawing Sheets

5,465,268

DIGITAL DECODING OF BIPHASE-MARK ENCODED SERIAL DIGITAL SIGNALS

BACKGROUND OF THE INVENTION

The present invention relates to the decoding of serial digital signals, and more particularly to the digital decoding of biphase-mark encoded serial digital signals.

An internationally recognized standard for transmitting a digitized audio signal is known as AES-3 1992. Under this standard the digital audio signal is serialized and then encoded to form a polarity-free signal. This encoding, known as biphase-mark, encodes the digital audio signal so that each bit has a transition to the opposite polarity at the end of each bit interval. Logical "ones" have an additional transition in the middle of the bit interval. Decoding of this encoded audio signal requires extracting a clock signal from the encoded audio signal as well as extracting the sequence of logical "ones" and "zeros" that represent the signal content.

Prior decoders, such as the CS8411 manufactured by Crystal Semiconductor Corporation of Austin, Tex., U.S. of America, use an analog decoding technique. The serial digital audio signal is input to the decoder, which includes an analog phase-locked loop, to recover the clock that is used to decode the signal. These decoders are expensive and susceptible to jitter so that they do not always decode properly when the transitions in the signal do not always occur at the precise expected time.

Thus a method of decoding biphase-mark encoded serial digital signals is desired that is less expensive and less susceptible to jitter than prior decoders.

SUMMARY OF THE INVENTION

The present invention provides a digital decoder for a biphase-mark encoded serial digital signal, such as an AES serial digital audio signal. The encoded signal is sampled by a sample clock to detect edges in the signal, the detected edges forming a blivet signal. The blivet signal is input to a one-bit digital lowpass filter to recover a low frequency component as a decoded clock signal and to generate a window signal about a midpoint range within each bit interval defined by the decoded clock signal. The window and blivet signals are used to derive a transition clock signal, and the transition and decoded clock signals produce a decoded serial digital signal by outputting a logical one for each bit interval within which a transition occurs and a logical zero for each bit interval otherwise.

The objects, advantages and other novel features of the present invention are apparent from the following detailed description when read in conjunction with the appended claims and attached drawing.

DESCRIPTION OF THE PREFERRED EMBODIMENT

Figure 1:
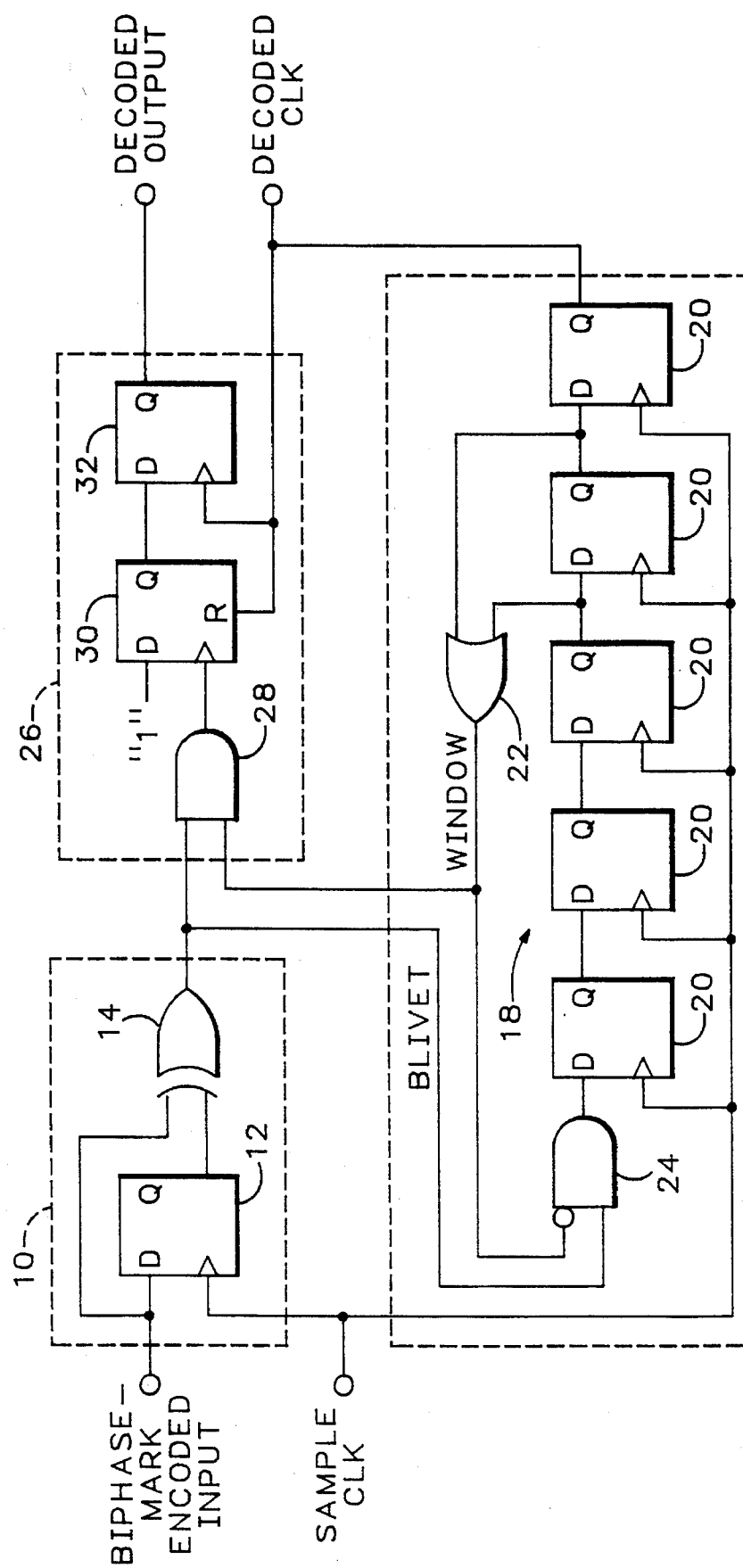
FIG. 1 is a block diagram view of a digital decoder for biphase-mark encoded serial digital signals according to the present invention.
Figure 2:
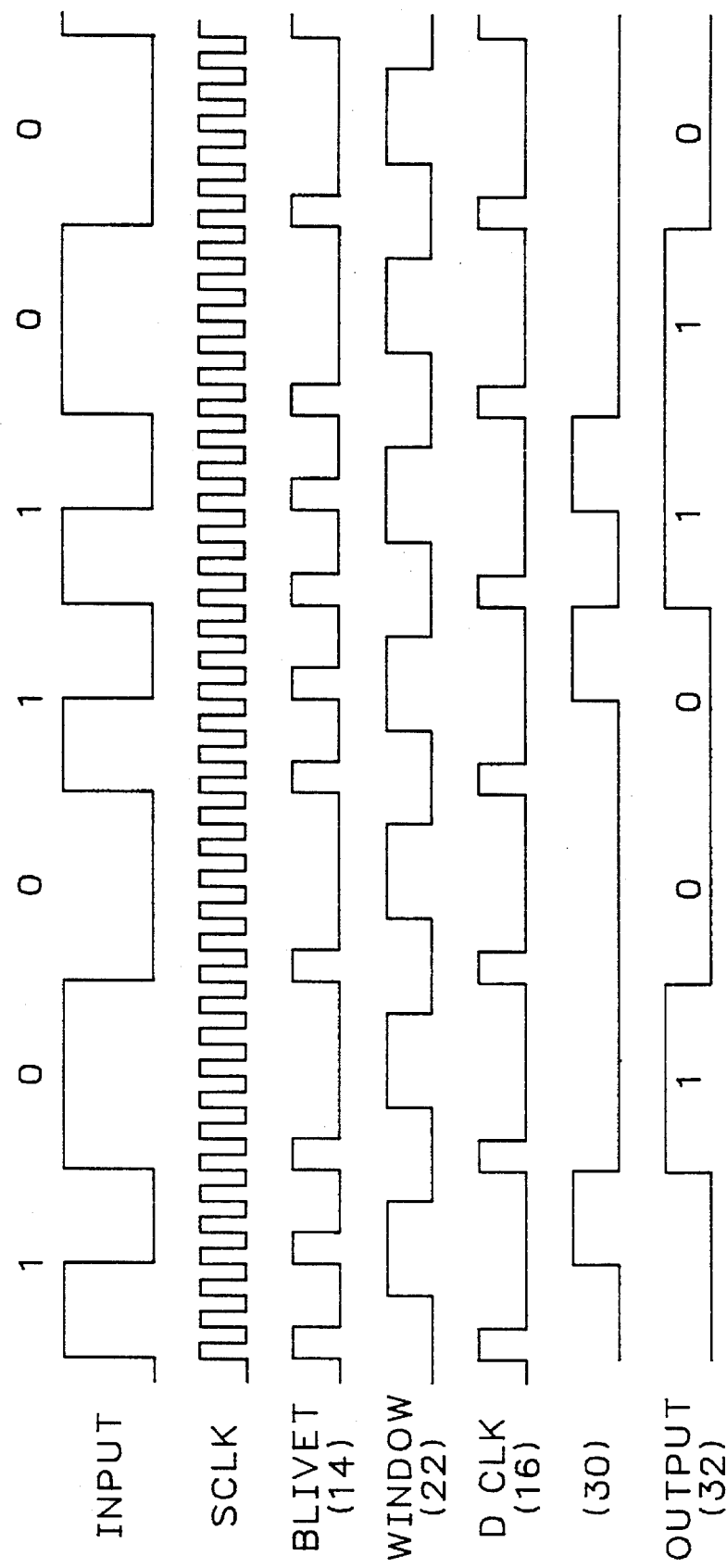
FIG. 2 is a timing diagram for the digital decoder of FIG. 1 according to the present invention.

Referring now to FIGS. 1 and 2 a biphase-mark encoded serial digital signal, such as an AES serial digital audio signal, is input to an edge detector circuit 10. In the edge detector circuit 10 the input signal is sampled by a first flip-flop 12 that is clocked by a sample clock. The sample clock is unrelated to the input signal except that it is greater than twice a higher frequency component of the input signal. The input signal and the output of the first flip-flop 12 are input to an exclusive OR gate 14. The output from the exclusive OR gate 14 is a BLIVET signal that represents an edge in the input signal, either rising or falling.

The BLIVET signal is input to a one-bit digital lowpass filter 16 which is tuned to pass only a lower frequency component of the input signal to produce a decoded clock signal. The digital filter 16 includes a digital tapped delay line 18 having a plurality of delay flip-flops 20 coupled in series and clocked by the sample clock. The digital filter 16 also provides a WINDOW signal. The WINDOW signal is formed by inputting two or more taps from the digital delay line 18 to a logical OR gate 22. The taps selected for the WINDOW signal are used to tune the digital filter 16. The WINDOW signal occurs at intervals that encompass edges, as indicated by the BLIVET signal, that fall between those representative of the low frequency component of the input signal. The WINDOW signal is applied to an inverting input of an AND gate 24, and the BLIVET signal is applied to a non-inverting input of the AND gate. The AND gate 24 acts to block transitions of the input signal that represent the high frequency component from entering the digital delay line 18. An edge from the BLIVET signal is passed by the AND gate 24 when the WINDOW signal is low. The edge is passed down the digital delay line 18 to form a decoded clock pulse. The taps of the delay line 18 provide the WINDOW signal about a point midway between low frequency component edges of the BLIVET signal so that transitions which occur between low frequency component edges are blocked from entering the delay line 18.

The WINDOW and BLIVET signals also are input to a bit decoder circuit 26 together with the decoded clock signal from the one-bit digital lowpass filter 16. The WINDOW and BLIVET signals are input to a decoder AND gate 28 which detects transitions in the middle of a bit interval defined by the decoded clock signal, which transitions represent a logic "1". Such transitions clock a first decode flip-flop 30 which transfers a logical "1" to its output. The first decode flip-flop 30 is reset by the decoded clock signal at the end of the bit interval. The decoded clock signal also clocks a second decode flip-flop 32 to transfer the output from the first decode flip-flop 30 to the output as the decoded output signal having logical "1"s and "0"s. If there is no transition within a bit interval, then the first decode flip-flop 30 is not set and a zero is transferred to the output. If there is a transition within the bit interval, then a one is transferred to the output.

Thus the present invention provides a digital decoder for a biphase-mark encoded serial digital signal by detecting edges in the signal, deriving a decoded clock signal from the low frequency component of the edges which defines bit intervals for the signal, and decoding the signal as a function of the decoded clock signal and transitions in the bit intervals.

What is claimed is:

1. An apparatus for digitally decoding a biphase-mark encoded serial digital signal comprising:

means for digitally detecting edges in the encoded serial digital signal to produce a blivet signal;

means for digitally filtering the blivet signal to regenerate a decoded clock signal that defines bit intervals for the encoded serial digital signal; and means for digitally decoding the encoded serial digital signal as a function of the blivet signal and the decoded clock signal, according to the presence/absence of a transition representing an edge of the encoded serial digital signal in the middle of each bit interval defined by the decoded clock signal, to produce a decoder serial digital signal.

2. The apparatus as recited in claim 1 wherein the detecting means comprises:

a flip-flop having an input, an output and a clock terminal, the encoded serial digital signal being coupled to the input and a sample clock signal being coupled to the clock terminal; and an exclusive OR gate having as inputs the encoded serial digital signal and the output from the flip-flop to produce the blivet signal at an output.

3. The apparatus as recited in claim 1 wherein the filtering means comprises:

a digital tapped delay line having an input and an output, the decoded clock signal being taken from the output; and means for passing a low frequency component of the blivet signal, corresponding to the decoded clock signal, to the input of the digital tapped delay line.

4. The apparatus as recited in claim 3 wherein the passing means comprises:

an AND gate having an inverting input, a non-inverting input and an output, the blivet signal being coupled to the non-inverting input and the output being coupled to the input of the digital tapped delay line; and an OR gate having as inputs taps from the digital tapped delay line and as an output a window signal, the taps being selected so that the window signal delimits a region in the middle of each bit interval, with the window signal being coupled to the inverting input of the AND gate.

5. The apparatus as recited in claim 1 wherein the decoding means comprises:

an AND gate having as inputs the blivet signal and a window signal that delimits a region in the middle of each bit interval and provides a transition clock signal at an output; and means for regenerating the decoded serial digital signal as a function of the transition and decoded clock signals.

6. The apparatus as recited in claim 5 wherein the regenerating means comprises:

a first flip-flop which is clocked by the transition clock signal and reset by the decoded clock signal, the first flip-flop having a logic one as an input and having an output; and a second flip-flop which is clocked by the decoded clock signal and has an input coupled to the output of the first flip-flop to provide the decoded serial digital signal at an output.

7. A method of digitally decoding a biphase-mark encoded serial digital signal comprising the steps of:

detecting edges of the encoded serial digital signal to generate a blivet signal;

digitally filtering the blivet signal to regenerate a decoded clock signal that defines bit intervals for the encoded serial digital signal; and decoding the encoded serial digital signal as a function of the blivet signal and the decoded clock signal, according to the presence/absence of a transition representing an edge of the encoded serial digital signal in the middle of each bit interval defined by the decoded clock signal, to produce a decoded serial digital signal.

8. The method as recited in claim 7 wherein the detecting means comprises the steps of:

sampling the encoded serial digital signal at a sampling rate greater than twice the highest frequency component of the encoded serial digital signal; and comparing consecutive samples of the encoded serial digital signal to generate a blivet signal when consecutive samples are of opposite logic states.

9. The method as recited in claim 7 wherein the filtering step comprises the steps of:

passing a low frequency component of the blivet signal; and digitally delaying the low frequency component to produce the decoded clock signal.

10. The method as recited in claim 9 wherein the passing step comprises the steps of:

generating a window signal within each bit interval that encompasses a high frequency component of the blivet signal; and blocking the high frequency component from being processed by the delaying step.

11. The method as recited in claim 7 wherein the decoding step comprises the steps of:

generating a transition clock signal from the blivet signal and a window signal that encompasses a high frequency component of the blivet signal; and regenerating the decoded serial digital signal as a function of the transition and decoded clock signals.

12. The method as recited in claim 11 wherein the regenerating step comprises the steps of:

clocking in response to the decoded clock signal a logic one to an output as the decoded serial digital signal when the transition clock signal occurs within a bit interval; and clocking in response to the decoded clock signal a logic zero to the output as the decoded serial digital signal when there is no transition clock signal within the bit interval.

* * * * *